(12) United States Patent
Lanzillo et al.

(10) Patent No.: US 12,424,549 B2
(45) Date of Patent: Sep. 23, 2025

(54) SKIP-LEVEL TSV WITH HYBRID DIELECTRIC SCHEME FOR BACKSIDE POWER DELIVERY

(71) Applicant: International Business Machines Corporation, Armonk, NY (US)

(72) Inventors: Nicholas Anthony Lanzillo, Wynantskill, NY (US); Ruilong Xie, Niskayuna, NY (US); Huai Huang, Clifton Park, NY (US); Hosadurga Shobha, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 17/837,434

(22) Filed: Jun. 10, 2022

(65) Prior Publication Data

US 2023/0402381 A1   Dec. 14, 2023

(51) Int. Cl.
*H01L 23/528* (2006.01)
*H01L 21/768* (2006.01)
*H01L 23/48* (2006.01)

(52) U.S. Cl.
CPC .... *H01L 23/5286* (2013.01); *H01L 21/76831* (2013.01); *H01L 21/76898* (2013.01); *H01L 23/481* (2013.01)

(58) Field of Classification Search
CPC .......... H01L 23/5286; H01L 21/76831; H01L 21/76898; H01L 23/481; H01L 23/5226; H01L 23/535

See application file for complete search history.

(56) References Cited

U.S. PATENT DOCUMENTS

| 8,841,200 | B2 | 9/2014 | Cheng et al. |
| 9,093,503 | B1 | 7/2015 | Chen et al. |
| 9,299,676 | B2 | 3/2016 | Yu et al. |
| 9,608,026 | B2 | 3/2017 | Park et al. |
| 10,020,255 | B1 * | 7/2018 | Bao .................... H01L 21/76804 |
| 10,083,905 | B2 * | 9/2018 | Briggs .............. H01L 21/76813 |

(Continued)

FOREIGN PATENT DOCUMENTS

| EP | 4537391 A1 | 4/2025 |
| KR | 2010-0050328 A | 5/2010 |

(Continued)

OTHER PUBLICATIONS

International Search Report dated Sep. 15, 2023, received in a corresponding foreign application, 11 pages.

(Continued)

*Primary Examiner* — Bac H Au
(74) *Attorney, Agent, or Firm* — Scully, Scott, Murphy & Presser, P.C.; L. Jeffrey Kelly, Esq.

(57) ABSTRACT

A skip-level through-silicon via structure is provided that enables low resistance via connection for backside power distribution by skipping one or more intermediate backside metal layers. The skip-level through-silicon via structure can enable a greater design flexibility for power grid. The skip-level through-silicon via structure has a large size that provides lower through-silicon via resistance as compared with conventional through-silicon via structures.

15 Claims, 7 Drawing Sheets

(56) References Cited

U.S. PATENT DOCUMENTS

| | | | |
|---|---|---|---|
| 10,622,301 B2* | 4/2020 | Xu | H01L 21/02186 |
| 10,636,739 B2 | 4/2020 | Beyne et al. | |
| 10,700,207 B2 | 6/2020 | Chen et al. | |
| 10,886,224 B2 | 1/2021 | Gerousis et al. | |
| 11,041,211 B2 | 6/2021 | Jain | |
| 11,152,298 B2* | 10/2021 | Mignot | H01L 23/53209 |
| 12,154,852 B2* | 11/2024 | Hsu | H01L 21/76816 |
| 2002/0020862 A1 | 2/2002 | Livengood et al. | |
| 2012/0104622 A1* | 5/2012 | Kim | H01L 21/7681 |
| | | | 257/774 |
| 2018/0114752 A1* | 4/2018 | Briggs | H01L 23/528 |
| 2018/0342454 A1* | 11/2018 | Zhang | H01L 21/76811 |
| 2019/0021176 A1* | 1/2019 | Law | H05K 3/4038 |
| 2020/0105671 A1 | 4/2020 | Lai et al. | |
| 2020/0135640 A1* | 4/2020 | Sio | H01L 23/5226 |
| 2020/0335428 A1 | 10/2020 | Chen | |
| 2020/0357692 A1* | 11/2020 | Mignot | H01L 21/76816 |
| 2021/0028112 A1* | 1/2021 | Kim | H10D 84/038 |
| 2021/0305130 A1 | 9/2021 | Cho et al. | |
| 2021/0375723 A1 | 12/2021 | Lin et al. | |
| 2021/0398879 A1 | 12/2021 | Huang et al. | |
| 2022/0384311 A1 | 12/2022 | Oh et al. | |
| 2023/0402381 A1* | 12/2023 | Lanzillo | H01L 23/5226 |
| 2023/0420359 A1* | 12/2023 | Xie | H01L 21/76895 |
| 2024/0030134 A1* | 1/2024 | Cheng | H10D 30/014 |
| 2024/0153867 A1* | 5/2024 | Lanzillo | H01L 23/5286 |
| 2024/0170404 A1* | 5/2024 | Lanzillo | H01L 23/53295 |

FOREIGN PATENT DOCUMENTS

| | | |
|---|---|---|
| KR | 10-2024-0158286 A | 11/2024 |
| WO | 2023/237362 A1 | 12/2023 |

OTHER PUBLICATIONS

Ryckaert, J., et al., "Extending the roadmap beyond 3nm through system scaling boosters: A case study on Buried Power Rail and Backside Power Delivery", 2019 Electron Devices Technology and Manufacturing Conference (EDTM). Date of Conference: Mar. 12-15, 2019, pp. 50-52.

* cited by examiner

SKIP-LEVEL TSV WITH HYBRID DIELECTRIC SCHEME FOR BACKSIDE POWER DELIVERY

BACKGROUND

The present application relates to semiconductor technology, and more particularly to a semiconductor structure having a low resistance via connection for backside power distribution.

The goal of a power delivery network is to provide power and reference voltage to the active devices on the die, in the most efficient way. This network is essentially a network of interconnects that is separate from the signal network. Traditionally, both networks are fabricated through back-end-of-line (BEOL) processing on the frontside of the wafer.

In recent years, the power distribution has been moved to the backside of the wafer. Backside power delivery allows direct power delivery to the standard cells, and promises to enhance system performance, increase chip area utilization, and reduce BEOL complexity. Using backside power delivery turns out to be an efficient way of delivering power to the circuits. For example, it largely improves the supply-voltage (or IR) drop that is caused by a resistance increase in the BEOL of traditional designs.

In some designs, the backside power delivery is connected to a buried power rail (BPR) using a through-silicon via (TSV). In such backside power delivery schemes, the TSV is present only in the semiconductor substrate and the TSV is electrically connected to the first backside metal layer that is present in a backside dielectric material region that is located beneath the semiconductor substrate. Via interconnects are used to electrically connect each of the subsequent backside metal layers that are located beneath the first backside metal layer. Such traditional backside power delivery schemes have a relatively high resistance.

SUMMARY

A skip-level through-silicon via structure is provided that enables low resistance via connection for backside power distribution by skipping one or more intermediate backside metal layers. The skip-level through-silicon via structure can enable a greater design flexibility for power grid. The skip-level through-silicon via structure has a large dimension that provides lower through-silicon via resistance as compared with conventional TSV structures.

In one aspect of the present application, a semiconductor structure is provided. In one embodiment, the semiconductor structure includes a skip-level through-silicon via structure having a first portion, a second portion, a first surface and a second surface opposite the first surface. In accordance with the present application, the first portion of the skip-level through-silicon via structure is in direct physical contact with the second portion of the skip-level through-silicon via structure. A semiconductor substrate is located laterally adjacent to the first portion of the skip-level through-silicon via structure, and a dielectric barrier layer separates the semiconductor substrate from the first portion of the skip-level through-silicon via structure. A backside dielectric material region is located laterally adjacent to, and is in direct physical contact with, a sidewall of the second portion of the skip-level through-silicon via structure. A buried power rail is located in the semiconductor substrate and is in electrical contact with the first surface of the skip-level through-silicon via structure. An n+1 backside metal layer is located in the backside dielectric material region and is in electrical contact with the second surface of the skip-level through-silicon via structure. In accordance with the present application, the skip-level through-silicon via structure skips electrical connection with each intermediate backside metal layer located above the n+1 backside metal layer.

In embodiments of the present application, the first portion of the skip-level through-silicon via structure has a width that is less than a width of the second portion of the skip-level through-silicon via structure.

In one embodiment of the present application, n is 1, and the skip-level through-silicon via structure skips electrical connection to a first backside metal layer. In another embodiment of the present application n is 2, and the skip-level through-silicon via structure skips electrical connection to a first backside metal layer and a second backside metal layer.

In embodiments of the present application, each intermediate backside metal layer that is located above the n+1 backside metal layer is located in the backside dielectric material region.

In embodiments of the present application, the backside dielectric material region is located beneath the semiconductor substrate and forms a material interface with a surface of the semiconductor substrate.

In embodiments of the present application, a portion of the dielectric barrier layer contacts a sidewall of the backside dielectric material region; the dielectric barrier layer does not cover the entirety of the sidewall of the backside dielectric material region. Instead, the physically exposed portion of the backside dielectric material region is in direct physical contact with the skip-level through-silicon via structure.

In embodiments of the present application, the buried power rail has a width that is greater than a width of the first portion of the skip-level through-silicon via structure.

In embodiments of the present application, the n+1 backside metal layer has a width greater than a width of the second portion of the skip-level through-silicon via structure. Also, the n+1 backside metal layer has a width greater than a width of each intermediate backside metal layer that is located above the n+1 backside metal layer.

In some embodiments of the present application, a non-skip-level through-silicon via structure is also present and is located in the semiconductor substrate and spaced apart from the skip-level through-via structure. The non-skip-level through-silicon via structure in such an embodiment is separated from the semiconductor substrate by another dielectric barrier layer. In such an embodiment, the non-skip-level through-silicon via structure has a first surface in electrical contact with the buried power rail, and a second surface opposite the first surface that is in electrical contact with a first backside metal layer that comprises one of the intermediate backside metal layers. In some instances of this embodiment of the present application, an electrically conductive via structure electrically connects the first backside metal layer to a second backside metal layer, wherein the second backside metal layer is the n+1 backside metal layer.

In embodiments of the present application, the skip-level through-silicon via structure is composed of an electrically conductive metal or an electrically conductive metal alloy, and the n+1 backside metal layer and each intermediate backside metal layer are composed of a backside metal or backside metal alloy.

In embodiments of the present application, each intermediate backside metal layer is spaced apart from the skip-level through-silicon via structure and from the n+1 backside metal layer by the backside dielectric material region.

In another aspect of the present application, a method of forming a semiconductor structure is provided. In one embodiment of the present application, the method includes forming a skip-level through-silicon via in a material stack comprising a backside dielectric material region and a semiconductor substrate. A first dielectric material layer is then formed in the skip-level through-silicon via, and thereafter a second dielectric material layer is formed on the first dielectric material layer and in the skip-level through-silicon via. Next, the first dielectric material layer and the second dielectric material layer are recessed to provide a recessed first dielectric material layer and a recessed second dielectric material layer, respectively, and to physically expose a sidewall of the backside dielectric material region. After the recessing, each of the recessed first dielectric material layer and the recessed second dielectric material layer has a topmost surface that is located between a topmost surface and a bottommost surface of the backside dielectric material region. The recessed second dielectric material layer is then removed selectively to the recessed first dielectric material layer, and thereafter a bottommost horizontal portion of the recessed first dielectric material layer is removed to provide a dielectric material barrier layer. Next, a skip-level through-silicon via structure is formed in the skip-level through-silicon via and on the dielectric material barrier layer. In accordance with the present application, the dielectric material barrier layer separates the skip-level through-silicon via structure from the semiconductor substrate.

In embodiments of the present application, the first dielectric material layer is composed of a first dielectric material that is compositionally different from a second dielectric material that provides the second dielectric material layer.

In embodiments of the present application, the forming the skip-level through-silicon via structure includes depositing an electrically conductive metal or electrically conductive metal alloy in the skip-level through-silicon via and atop the backside dielectric material region; and removing the electrically conductive metal or electrically conductive metal alloy that is located outside the skip-level through-silicon via and from atop the backside dielectric material region.

In embodiments of the present application, a buried power rail is located beneath the semiconductor substrate.

In embodiments of the present application, the method can further include forming a n+1 backside metal layer in electrical contact a surface of the skip-level through-silicon via structure.

DETAILED DESCRIPTION

Figure 1:
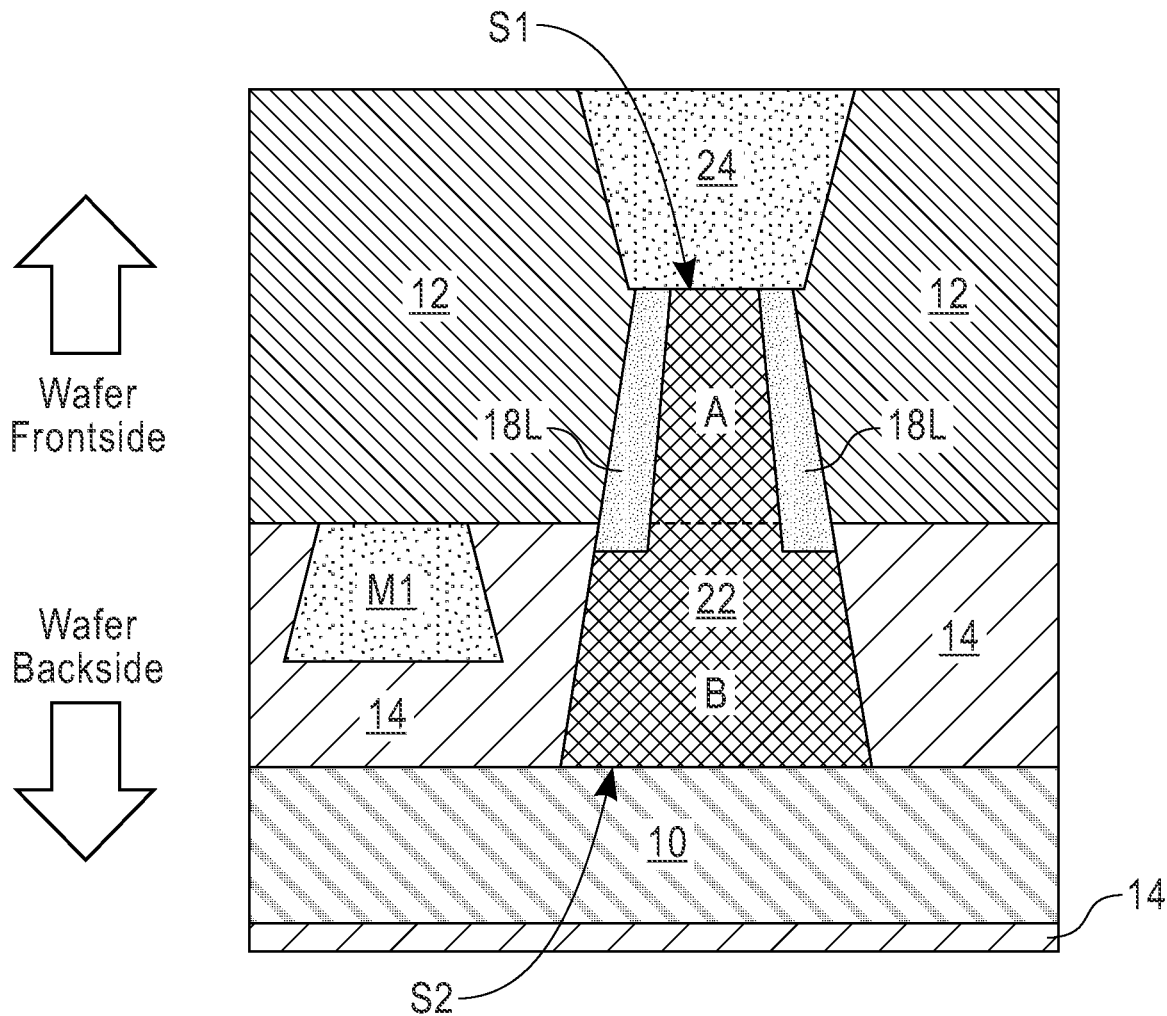
FIG. 1 is a cross sectional view of an exemplary semiconductor structure in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
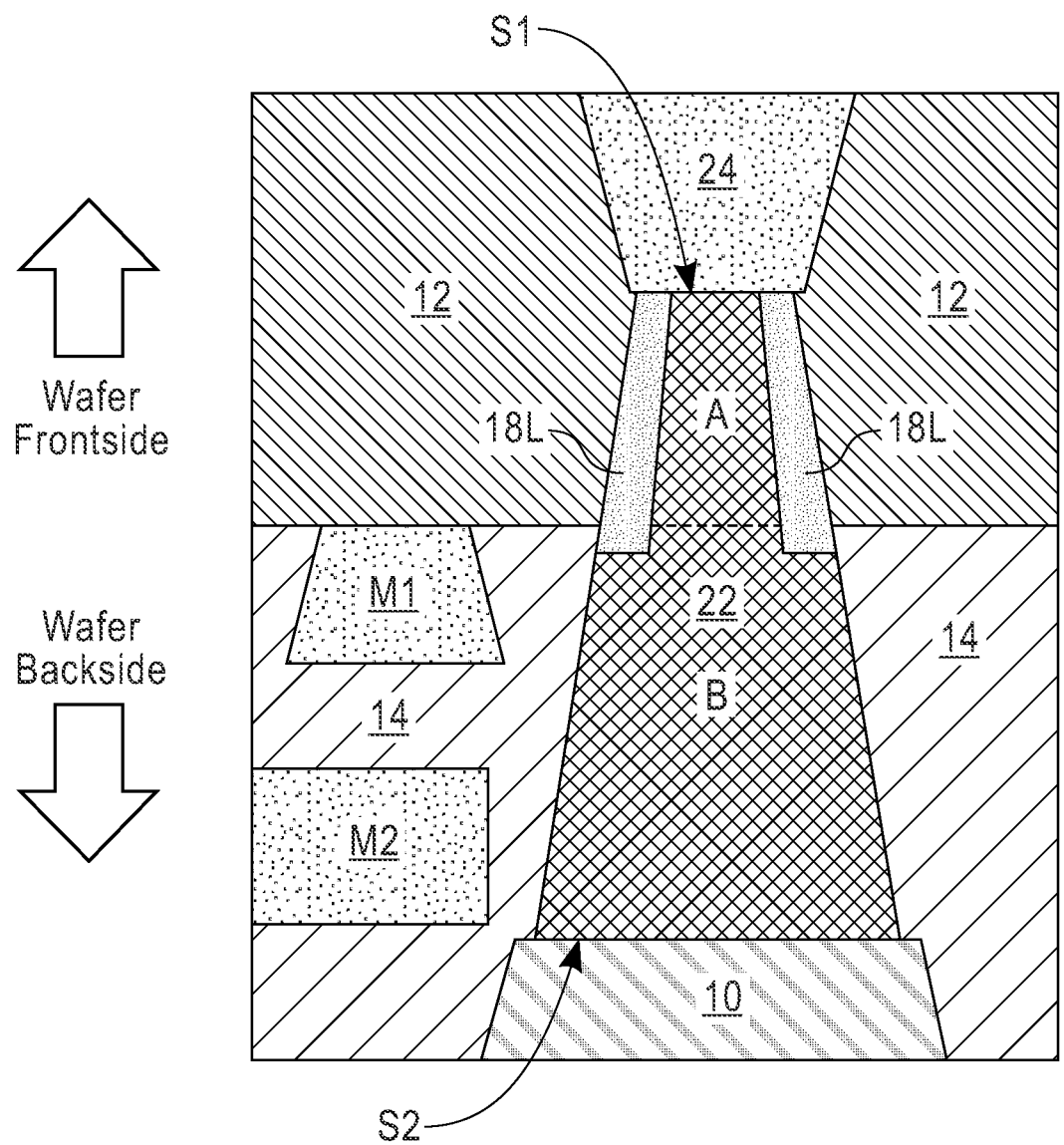
FIG. 2 is a cross sectional view of an exemplary semiconductor structure in accordance with another embodiment of the present application.
Figure 3:
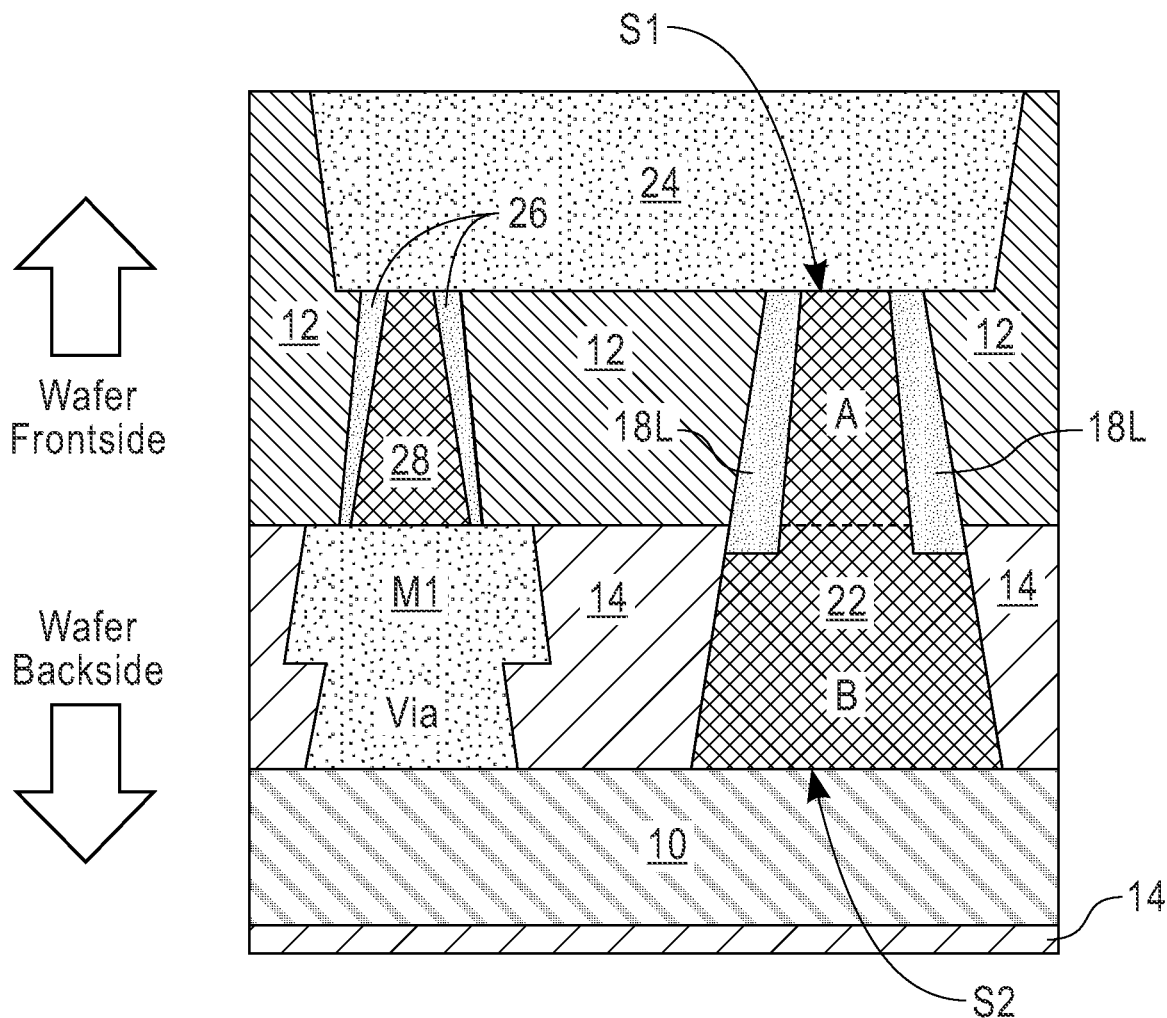
FIG. 3 is a cross sectional view of an exemplary semiconductor structure in accordance with yet another embodiment of the present application.

Referring first to FIGS. 1-3, there are illustrated exemplary semiconductor structures in accordance with various embodiments of the present application. FIG. 1 shows a direct backside metal layer (i.e., n+1 backside metal layer 10) to buried power rail 24 connection with the skip-level through-silicon via structure 22 skipping the first backside metal layer, M1. FIG. 2 shows an embodiment in which the skip-level through-silicon via structure 22 skips multiple (e.g., M1 and M2) intermediate backside metal layers; in FIG. 2 the skip-level through-silicon via structure electrically connects the third backside metal layer (M3) to the buried power rail 24 while skipping M1 and M2. FIG. 3 shows an embodiment in which the buried power rail 24 has a large enough width to allow the buried power rail 24 to be simultaneously connected to a traditional (i.e., non-skip-level) through-silicon via structure 28 as well as a skip level through-silicon via structure 22.

Each of the exemplary semiconductor structures includes a skip-level through-silicon via structure 22 in accordance with the present application. Throughout the present application, the term "skip-level through-silicon via structure" denotes a through-silicon via structure that electrically contacts an n+1 backside metal layer 10 while skipping electrical connection with each intermediate backside metal layer located above the n+1 backside metal layer. In one example, the skip-level through-silicon via structure 22 electrically contacts a second backside metal layer (n=1, i.e., M2), while skipping a first backside metal layer (M1). Traditional through-silicon via structures used in backside power delivery schemes are electrically contacted with the first backside metal layer (M1).

Notably, the exemplary semiconductor structures illustrated in FIGS. 1-3 include a skip-level through-silicon via structure 22 having a first portion A, a second portion B, a first surface S1 and a second surface S2 opposite the first surface S1. In accordance with the present application and is illustrated in FIGS. 1-3, the first portion A of the skip-level through-silicon via structure 22 is in direct physical contact with the second portion B of the skip-level through-silicon via structure 22; in FIGS. 1-3 a dotted line is shown to illustrate a hypothetical boundary between the different portions of the skip-level through-silicon via structure 22. In each of FIGS. 1-3, arrows are provided that show the direction of the frontside (i.e., "wafer frontside") and backside (i.e., "wafer backside") of the exemplary semiconductor structure.

In embodiments of the present application, the first portion A of the skip-level through-silicon via structure 22 has a width that is less than a width of the second portion B of the skip-level through-silicon via structure 22. In one example, the width of the first portion A of the skip-level through-silicon via structure 22 is from 10 nm to 100 nm, while the width of the second portion B of the skip-level through-silicon via structure 22 is from 100 nm to 500 nm.

In embodiments of the present application and as is shown in each of FIGS. 1-3, the backside dielectric material region 14 is located beneath the semiconductor substrate 12 and forms a material interface with a surface of the semiconductor substrate 12.

In embodiments of the present application and as is shown in FIGS. 1-3, a portion of the dielectric barrier layer 18L can contact a sidewall of the backside dielectric material region 14; the dielectric barrier layer 18L does not however contact the entirety of the sidewall of the backside dielectric material region 14.

In embodiments of the present application and as is shown in FIGS. 1-3, the buried power rail 24 has a width that is greater than a width of the first portion A of the skip-level through-silicon via structure 22. Typically, the buried power rail 24 has a width from 10 nm to 100 nm, while the first portion A of the skip-level through-silicon via structure 22 was a width from 10 nm to 100 nm, as is mentioned above. It is noted that the width on the buried power rail 24 does not need to larger than the width of the second portion B of the skip-level through-silicon via structure 22. In some embodiments, the width of the second portion B of the skip-level through-silicon via structure 22 matches the width of the buried power rail 24. In FIGS. 1-3, the first portion A represents an upper portion of the skip-level through-silicon via structure 22, and the second portion B represents a lower portion of the skip-level through-silicon via structure 22.

A semiconductor substrate 12 is located laterally adjacent to the first portion A of the skip-level through-silicon via structure 22, and a dielectric barrier layer 18L separates the semiconductor substrate 12 from the first portion A of the skip-level through-silicon via structure 22. A backside dielectric material region 14 is located laterally adjacent to, and is in direct physical contact with, a sidewall of the second portion B of the skip-level through-silicon via structure 22. A buried power rail 24 is located in the semiconductor substrate 12 and is in electrical contact with the first surface S1 of the skip-level through-silicon via structure 22, and an n+1 backside metal layer 10 is located in the backside dielectric material region 14 and is in electrical contact with the second surface S2 of the skip-level through-silicon via structure 22. In accordance with the present application, the skip-level through-silicon via structure 22 skips electrical connection with each intermediate backside metal layer (M1 as shown in FIGS. 1 and 3, and both M1 and M2 as shown in FIG. 2) located above the n+1 backside metal layer 10. Note that in the drawings of the present application, M1 denotes a first backside metal layer, and M2 denotes a second backside metal layer.

It is noted that the dimension, i.e., width, of each successive backside metal layer (M1, M2, M3, etc.) increases as they get further away from the semiconductor devices, i.e., transistors, (not shown) that are formed on, or within the semiconductor substrate 12. As such, and by skipping one of the intermediate backside metal layers above the n+1 backside metal layer 10, the skip-level through-silicon via structure 22 enables lower resistance via connection for backside power distribution. Also, more design flexibility is afforded by using the skip-level through-silicon via structure 22 of the present application.

In one embodiment of the present application as shown in FIG. 1, n is 1, and the skip-level through-silicon via structure 22 skips electrical connection to a first backside metal layer M1. In another embodiment of the present application n is 2, and the skip-level through-silicon via structure 22 skips electrical connection to a first backside metal layer M1 and a second backside metal layer M2. It is noted that although the present application illustrates n=1 or n=2 for the n+1 backside metal layer 10, the present application contemplates other embodiments in which n is 3, 4, 5, etc. for the n+1 backside metal layer 10.

In some embodiments of the present application and as shown in FIG. 3, a non-skip-level through-silicon via structure 28 is also present and is located in the semiconductor substrate 12 and is spaced apart from the skip-level through-via structure 22. In such an embodiment, the non-skip-level through-silicon via structure 28 is separated from the semiconductor substrate 12 by another dielectric barrier layer 26. In such an embodiment, the non-skip-level through-silicon via structure 28 has a first surface in electrical contact with the buried power rail 24, and a second surface opposite the first surface that is in electrical contact with a first backside metal layer M1 that comprises one of the intermediate backside metal layers. In some instances of this embodiment of the present application, an electrically conductive via structure, Via, electrically connects the first backside metal layer M1 to a second backside metal layer which, in the illustrated embodiment, represents the n+1 backside metal layer 10 mentioned above. In the embodiment illustrated in FIG. 3, the buried power rail 24 has a width such that the buried power rail 24 is in electrical contact with both the skip-level through-silicon via structure 22 and the non-skip-level through-silicon via structure 28.

The various components/elements of the exemplary structures shown in FIGS. 1-3 will now be described in greater detail. The semiconductor substrate (or wafer) 12 that can be employed in the present application includes a semiconductor material that has semiconducting properties (i.e., a semiconductor material). Illustrative examples of semiconductor materials that can be used as the semiconductor substrate 12 include, but are not limned to, silicon (Si), germanium (Ge), a silicon germanium. (SiGe) alloy, silicon carbide (SiC), silicon germanium carbide (SiGeC), a III-V compound semiconductor or an if-VI compound semiconductor. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Although not shown, the semiconductor substrate 12 can be processed on the frontside of the wafer to include one or more semiconductor devices including, for example, transistors, on, or within, the semiconductor substrate 12; the backside of the wafer will be subsequently processed to include the backside dielectric material region 14. The semiconductor substrate 12 can also be processed to include dielectric isolation regions which are used to isolate different semiconductor devices from each other. For example, the semiconductor substrate 12 can be processed to include a shallow trench isolation (STI) region which electrically separates a p-type field effect transistor containing region from an n-type field effect transistor containing region.

Although also not shown, a back-end-of-the-line (BEOL) structure can be formed above the semiconductor substrate 12 so as to connect the frontside of the semiconductor substrate containing the semiconductor devices to remote devices. The BEOL structure includes one or more interconnect levels stacked one atop the other. Each of the interconnect levels includes at least one electrically conductive interconnect structure embedded in an interlevel dielectric material layer. The BEOL structure may or may not include frontside power devices.

The backside dielectric material region 14 includes one or more dielectric material layers that are formed on the backside of the semiconductor substrate 12 after the semiconductor substrate 12 has been processed to include one or more semiconductor devices, and after the BEOL structure is formed, and after backside thinning of the semiconductor substrate 12. The backside dielectric material region 14 is typically formed on a backside surface of the semiconductor substrate 12 utilizing a wafer bonding process. The one or more dielectric material layers that provide the backside dielectric material region 14 include any backside dielectric material including, but not limited to, silicon dioxide, porous silicon carbide, silicon nitride or any combination thereof. The backside dielectric material region 14 typically has a thickness from 100 nm to several microns; although other thicknesses for the backside dielectric material region 14 beside the range mentioned here are contemplated and can be used in the present application. Embedded within the backside dielectric material region 14 is the second portion B of the skip-level through-silicon via structure 22, the n+1 backside metal layer 10 and each intermediate backside metal layer (i.e., M1 or M1 and M2) located above the n+1 backside metal layer 10; the first portion A of the skip-level through-silicon via structure 22 is embedded in the semiconductor substrate 12.

The skip-level through-silicon via structure 22 is composed of an electrically conductive metal or an electrically conductive metal alloy. Illustrative examples of electrically conductive metals that can be used in the present application to provide the skip-level through-silicon via structure 22 include, but are not limited to, copper (Cu), aluminum (Al), tungsten (W), ruthenium (Ru), or cobalt (Co). Illustrative examples of electrically conductive metal alloys that can be used in the present application to provide the skip-level through-silicon via structure 22 include, but are not limited to, a Cu—Al alloy, a Cu—W alloy, or Ru—Co alloy.

The dielectric barrier layer 18L that separates the semiconductor substrate 12 from the first portion A of the skip-level through-silicon via structure 22 includes any dielectric material that prevents migration of the electrically conductive material that provides the skip-level through-silicon via structure 22 into the semiconductor substrate 12. Illustrative examples of dielectric materials that can be employed as the dielectric barrier layer 18L include, but are not limited to, a silicon nitride based dielectric material such as, for example, silicon nitride, silicon boron carbon nitride, or a dielectric including atoms of Si, O, C and N. The dielectric barrier layer 18L typically has a thickness, as measured from one sidewall to another sidewall, of from 5 nm to 50 nm; although other thicknesses for the dielectric barrier layer 18L beside the range mentioned here are contemplated and can be used in the present application.

The buried power rail 24 is composed of any electrically conductive power rail material including, but not limited to, tungsten (W), cobalt (Co), ruthenium (Ru), aluminum (Al), copper (Cu), platinum (Pt), rhodium (Rh), or palladium (Pd). The buried power rail 24 is formed within an opening that is formed into the semiconductor substrate 12. Notably, the buried power rail 24 is formed by deposition of electrically conductive power rail material into the opening that is formed into the semiconductor substrate 12.

The n+1 backside metal layer 10 and each intermediate backside metal layer (i.e., M1 or M1 and M2) located above the n+1 backside metal layer 10 are composed of one of the electrically conductive materials (i.e., electrically conductive metals or electrically conductive metal alloys) mentioned above for the skip-level through-silicon via structure 22. In some embodiments, the n+1 backside metal layer 10 and each intermediate backside metal layer (i.e., M1 or M1 and M2) located above the n+1 backside metal layer 10 are composed of the same electrically conductive material as each other. In such an embodiment, the electrically conductive material that provides the n+1 backside metal layer 10 and each intermediate backside metal layer (i.e., M1 or M1 and M2) can be compositionally the same as, or compositionally different from, the electrically conductive material that provides the skip-level through-silicon via structure 22. In other embodiments, the n+1 backside metal layer 10 is composed of an electrically conductive material that is compositionally different from at least one of intermediate backside metal layers (i.e., M1 or M1 and M2) located above the n+1 backside metal layer 10. In such an embodiment, the electrically conductive material that provides the n+1 backside metal layer 10 can be compositionally the same as, or compositionally different from, the electrically conductive material that provides the skip-level through-silicon via structure 22.

The non-skip-level through-silicon via structure 28 shown in FIG. 3 is composed of one of the electrically conductive materials (i.e., electrically conductive metals or electrically conductive metal alloys) mentioned above for the skip-level through-silicon via structure 22. The electrically conductive material that provides the non-skip-level through-silicon via structure 28 can be compositionally the same as, or compositionally different from, the electrically conductive material that provides the skip-level through-silicon via structure 22.

The another dielectric barrier layer 26 can be composed of one of the dielectric materials mentioned above for dielectric barrier layer 18L. The dielectric material that provides the another dielectric barrier layer 26 can be compositionally the same as, or compositionally different from, the dielectric material that provides the dielectric barrier layer 18L.

The "Via" shown in FIG. 3 is composed of one of the electrically conductive materials mentioned above for the n+1 backside metal layer 10 and the intermediate backside metal layers (i.e., M1 or M1 and M2). The electrically conductive material that provides the "Via" is typically a compositionally same electrically conductive material as that which provides the intermediate backside metal layer, M1, shown in FIG. 3.

Reference is now made to FIGS. 4A-4G, which are cross sectional views illustrating processing steps that can be used in providing the exemplary semiconductor structure of the present application. It is noted that the processing steps shown in FIGS. 4A-4G are performed on the backside of the wafer and after the semiconductor substrate 12 has been processed to include one or more semiconductor devices and buried power rail 24, and after the BEOL structure is formed, and after backside thinning of the semiconductor substrate 12. It is noted that FIGS. 4A-4G only show an area including the skip-level through-silicon structure 22 of the present application.

Figure 4A:
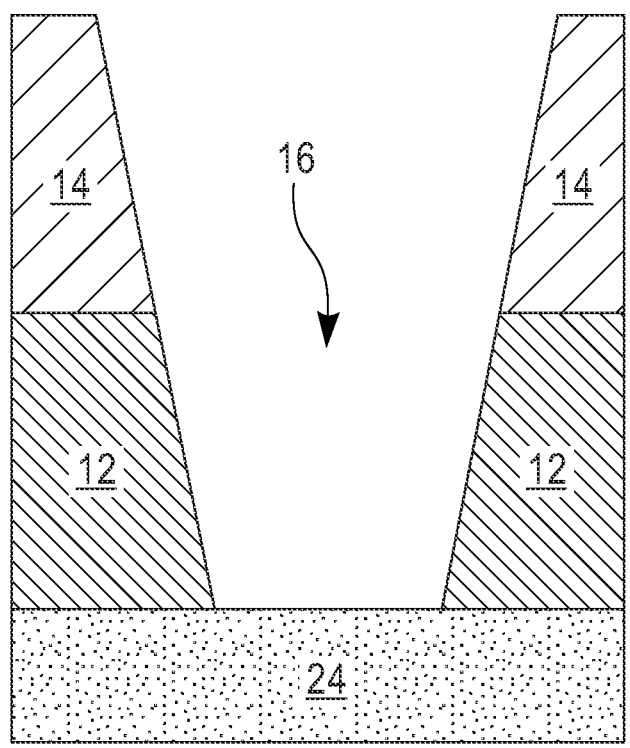
FIGS. 4A-4G are cross sectional views illustrating processing steps that can be used in providing the exemplary semiconductor structure of the present application.

Referring first to FIG. 4A, there is illustrated an exemplary structure that is formed after a skip-level through-silicon via 16 is formed in a material stack of backside dielectric material region 14 and semiconductor substrate 12. The material stack of the exemplary structure shown in FIG. 4A also includes buried power rail 24; although not shown in FIGS. 4A-4G, the buried power rail 24 is embedded in the semiconductor substrate 12 and is formed prior to forming the backside dielectric material region 14 on the backside of the semiconductor substrate 12. The backside dielectric material region 14 is composed of at least one of the dielectric mentioned above. In some embodiments, the backside dielectric material region 14 can be formed utilizing a wafer bonding process. In other embodiments, the backside dielectric material region 14 can be formed by a deposition process such as, for example, chemical vapor deposition (CVD), plasma enhanced chemical vapor deposition (PECVD), or physical vapor deposition (PVD). In yet other embodiments, the backside dielectric material region 14 can be formed utilizing a thermal growth process such as, for example, thermal oxidation or thermal nitridation.

It is noted that any immediate backside metal layers (i.e., M1, or M1 and M2) can be formed into the backside dielectric material region 14 prior to forming the skip-level through-silicon via 16 utilizing techniques well known to those skilled in the art.

After forming the backside dielectric material region 14 on the backside of the semiconductor substrate 12, the skip-level through-silicon via 16 is formed by a lithographic patterning process. The lithographic patterning process can include forming a photoresist material layer (not shown), with or without any pattern masking layers (also not shown), on a physically exposed surface of the backside dielectric material region 14, exposing the photoresist material layer to a desired pattern of irradiation, developing the exposed photoresist material layer, and transferring the pattern that is formed into the photoresist material layer to the material stack including the backside dielectric material region 14 and the semiconductor substrate 12 by utilizing an etching process. The etching process can include a dry etching process (such as, for example, reactive ion etching, ion beam etching or plasma etching) or a chemical wet etching process. The etching process removes an entirety of the backside dielectric material region 14 and an entirety of the semiconductor substrate 12 that are not protected by the patterned photoresist material layer and/or the patterned masking layers. The etching stops on a horizontal surface of the buried power rail 24 as is shown in FIG. 4A. The patterned photoresist material layer can be removed utilizing any photoresist removal process such as, for example, ashing.

In some embodiments, the skip-level through-silicon via 16 can have slanted sidewalls as shown in FIG. 4A; in FIG. 4A the sidewalls of the skip-level through-silicon via 16 taper inward from a topmost portion of the skip-level through-silicon via 16 to a bottommost portion of the skip-level through-silicon via 16. In other embodiments the skip-level through-silicon via 16 has sidewalls that are perpendicular to the horizontal surface of the buried power rail 24.

Figure 4B:
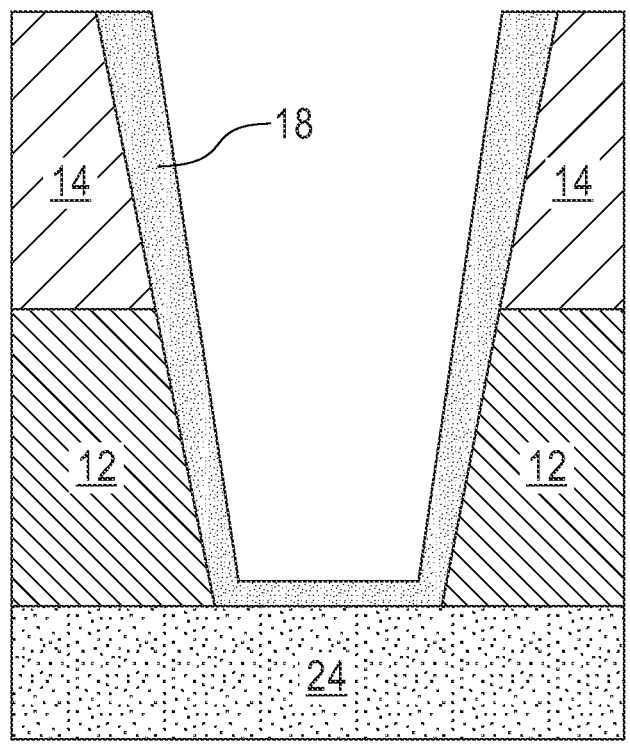

Referring now to FIG. 4B, there is illustrated the exemplary structure shown in FIG. 4A after forming a first dielectric material layer 18 in the skip-level through-silicon via 16. At this point of the present application, the first dielectric material layer 18 is present along the sidewalls and a bottom wall of the skip-level through-silicon via 16. The first dielectric material layer 18 is composed of a first dielectric material which is capable of preventing migration of electrically conductive metals or electrically conductive metal alloys into the semiconductor substrate 12. Illustrative examples of first dielectric materials that can be used as the first dielectric material layer 18 include, but are not limited to, a silicon nitride based dielectric material such as, for example, silicon nitride, silicon boron carbon nitride, or a dielectric including atoms of Si, O, C and N. Other dielectric materials beside a silicon nitride based dielectric can be used as the first dielectric material.

The first dielectric material layer 18 is typically a conformal layer. As used herein, the term "conformal layer" denotes that a material layer has a vertical thickness along horizontal surfaces that is substantially the same (i.e., within ±5%) as the lateral thickness along vertical surfaces. The first dielectric material layer 18 can be formed by a conformal deposition process, including but not limited to, atomic layer deposition (ALD), CVD, PECVD or PVD.

In some embodiments and as is depicted in FIG. 4B, a planarization process such as for example, chemical mechanical polishing (CMP) can be used to remove the first dielectric material layer from the horizontal surface of the backside dielectric material region 14. In other embodiments, the removal of the first dielectric material layer 18 from the horizontal surface of the backside dielectric material region 14 can occur after deposition of the second dielectric material layer 20. In such an embodiment, a planarization process such as, for example, CMP, can be used to remove the first and second dielectric material layers 18, 20 that are formed outside the skip-level through-silicon via 16 and on the horizontal surface of the backside dielectric material region 14.

The first dielectric material layer 18 can have a thickness from 5 nm to 50 nm, although lesser and greater thicknesses can also be employed. The first dielectric material layer 18 does not fill in the entirety of the skip-level through-silicon via 16.

Figure 4C:
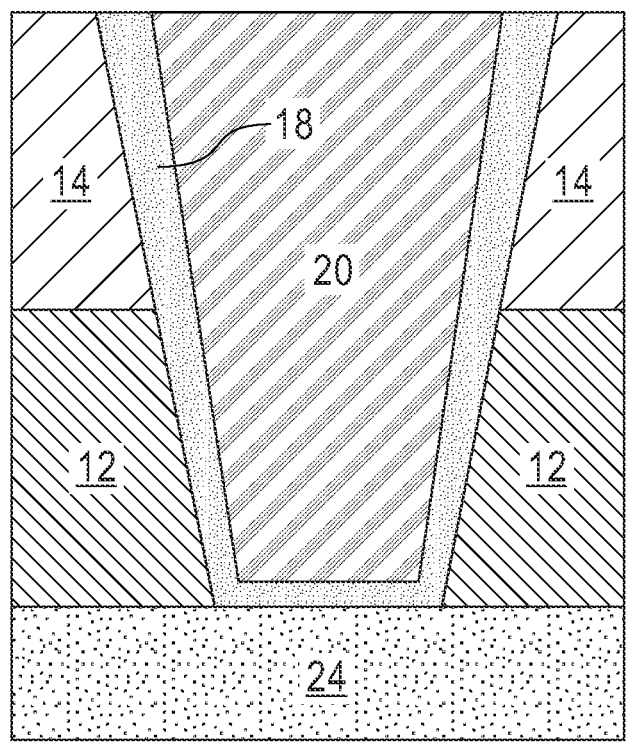

Referring now to FIG. 4C, there is illustrated the exemplary structure shown in FIG. 4B after forming a second dielectric material layer 20 on the first dielectric material layer 18 and in the skip-level through-silicon via 16. The second dielectric material layer 20 fills in a remaining volume of the skip-level through-silicon via 16. The second dielectric material layer 20 is composed of a second dielectric material which is compositionally different from the first dielectric material that provides the first dielectric material layer 18; by selecting compositionally different dielectric materials, the first and second dielectric materials have different etch rates in a particular etchant such that one of the dielectrics can be removed selectively to the other. In one example, and when the first dielectric material that provides the first dielectric material layer 18 is a silicon nitride based dielectric material, the second dielectric material that provides the second dielectric material layer 20 is a silicon carbon based dielectric material such as, for example, silicon carbide or a dielectric including atoms of Si, C and O. The second dielectric material that provides the second dielectric material layer 20 can be formed by ALD, CVD, PECVD, PVD, evaporation or spin-on coating.

After forming second dielectric material, a planarization process such as, for example, CMP, can be employed to remove the first dielectric material layer 18, if still present, and the second dielectric material layer 20 that are present outside of the skip-level through-silicon via 16. This planarization process (as well as the optional planarization process mentioned above to remove the first dielectric material layer 18 prior to forming the second dielectric material layer 20) stops on the horizontal surface of the backside dielectric material region 14.

Figure 4D:
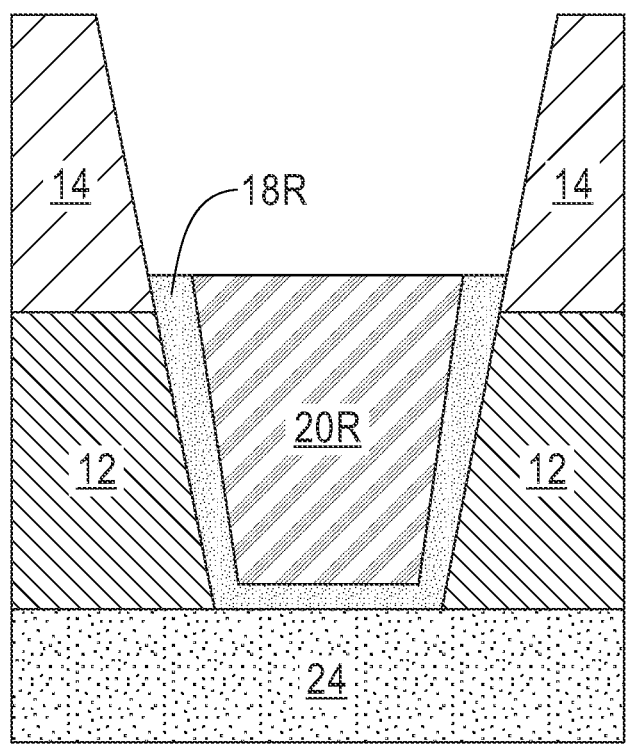

Referring now to FIG. 4D, there is illustrated the exemplary structure shown in FIG. 4C after recessing the first dielectric material layer 18 and the second dielectric material layer 20 to provide a recessed first dielectric material layer 18R and a recessed second dielectric material layer 20R, respectively, and to physically expose a sidewall of the backside dielectric material region 14. In embodiments of the present application, and after the recessing, each of the recessed first dielectric material layer 18R and the recessed second dielectric material layer 20R has a topmost surface that is located between a topmost surface and a bottommost surface of the backside dielectric material region 14. The recessing of the first dielectric material layer 18 and the second dielectric material layer 20 can be performed utilizing any recess etching process such as, for example, alanine (wet chemical example).

Figure 4E:
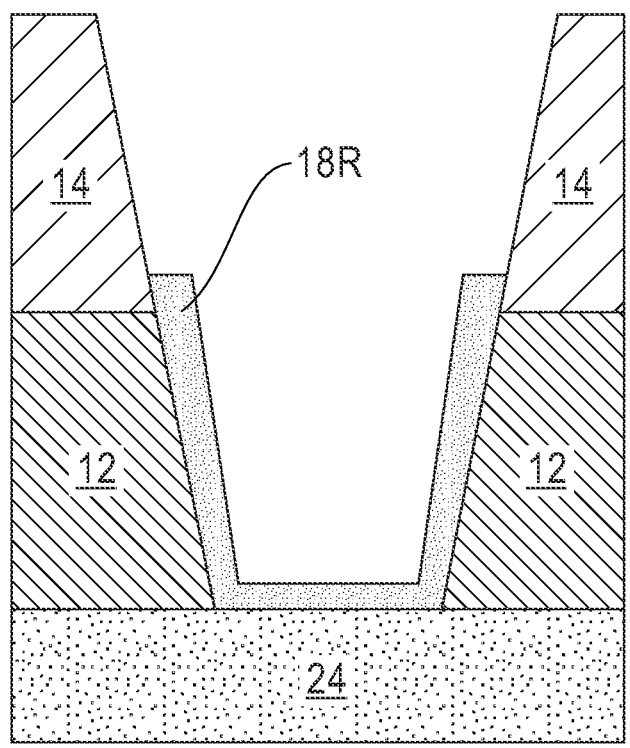

Referring now to FIG. 4E, there is illustrated the exemplary structure shown in FIG. 4D after removing the recessed second dielectric material layer 20R selectively to the recessed first dielectric material layer 18R. The selective removal of the recessed second dielectric material layer 20R is performed utilizing an etchant that has a greater affinity for removing the second dielectric material that provides the second dielectric material layer 20 relative to the first dielectric material that provides the first dielectric material layer 18. In one example, and when a silicon nitride based dielectric material is employed as the first dielectric material and a silicon carbon based dielectric material is employed as the second dielectric material, a $CF_3$ etch can be used to selectively remove the silicon carbon based dielectric material relative to the silicon nitride based dielectric material.

Figure 4F:
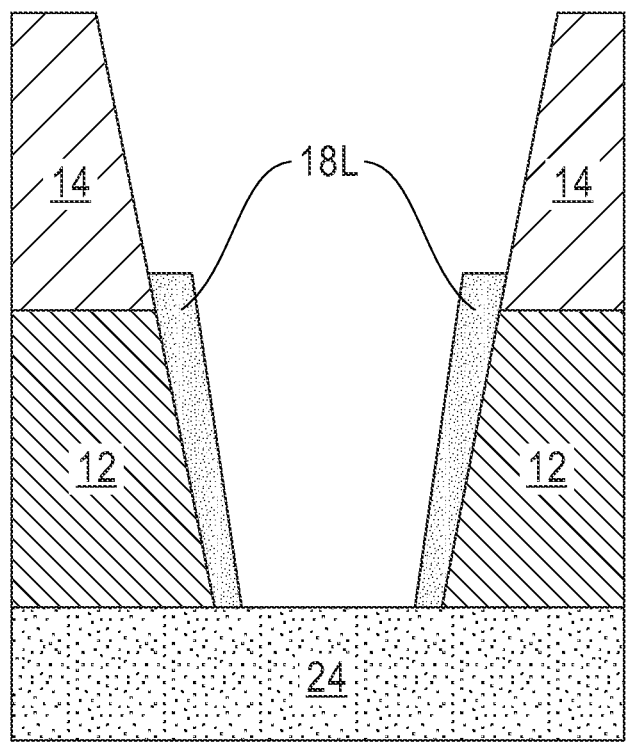

Referring now to FIG. 4F, there is illustrated the exemplary structure shown in FIG. 4E after removing a bottommost horizontal portion of the recessed first dielectric material layer 18R to provide dielectric material barrier layer 18L. The removal a bottommost horizontal portion of the recessed first dielectric material layer 18R can be performed utilizing a directional etching process. In one example, the directional etching process includes $SF_4/O$. The removal of bottommost horizontal portion of the recessed first dielectric material layer 18R physically exposes a surface of the buried power rail 24. The resultant dielectric material barrier layer 18L (which is composed of the first dielectric material mentioned above) is located on the entirety of the sidewalls of the semiconductor substrate 12 and partially on the sidewalls of the backside dielectric material region 14 that are physically exposed in the skip-level through-silicon via 16.

Figure 4G:
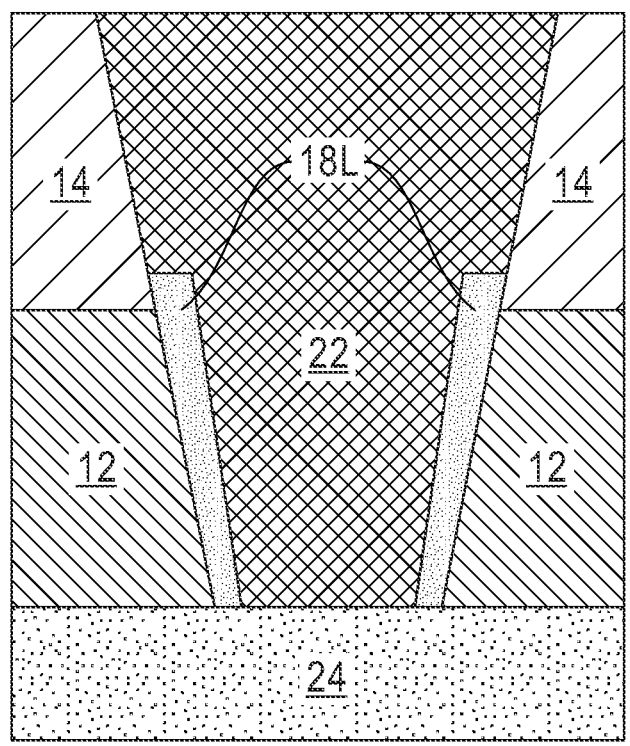

Referring now to FIG. 4G, there is illustrated the exemplary structure shown in FIG. 4F after forming a skip-level through-silicon via structure 22 in the skip-level through-silicon via 16 and on a dielectric barrier layer 18L. As is illustrated, the dielectric barrier layer 18L separates the skip-level through-silicon via structure 22 from the semiconductor substrate 12. The skip-level through-silicon via structure 22, which is present in both the semiconductor substrate 12 and the backside dielectric material region 14, includes one of the electrically conductive metals or electrically conductive metal alloys mentioned herein above. In one example, the skip-level through-silicon via structure 22 is composed of Cu.

The skip-level through-silicon via structure 22 can be formed by depositing an electrically conductive metal or electrically conductive metal alloy in the skip-level through-silicon via 16 and atop the backside dielectric material region 14, and thereafter the electrically conductive metal or electrically conductive metal alloy that is located outside the skip-level through-silicon via 16 and from atop the backside dielectric material region 14 is removed. The removal of the electrically conductive metal or electrically conductive metal alloy that is located outside the skip-level through-silicon via 16 and from atop the backside dielectric material region 14 can be performed utilizing a planarization process such as, for example, CMP. The depositing of the electrically conductive metal or electrically conductive metal alloy can include, but it not limited to, ALD, CVD, PECVD, PVD, plating or sputtering. A reflow anneal can be used in some embodiments of the present application after the electrically conductive metal or electrically conductive metal alloy has been deposited. The skip-level through-silicon via structure 22 is entirely housed in the skip-level through-silicon via 16 that is formed into the material stack of the backside dielectric material region 14 and the semiconductor substrate 12.

After forming the skip-level through-silicon via structure 22, the n+1 backside metal layer 10 can be formed in electrical contact with a surface of the skip-level through-silicon via structure 22. The n+1 backside metal layer 10 can be formed by deposition and optionally lithographic patterning, and thereafter additional backside dielectric material can be formed to embed the n+1 backside metal layer 10 in backside dielectric material. The structure shown in FIG. 4G can then be flipped 180° such that the buried power rail 26 is positioned atop the backside dielectric material region 14.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a skip-level through-silicon via structure having a first portion, a second portion, a first surface and a second surface opposite the first surface, wherein the first portion and the second portion are in direct physical contact with each other;
   a semiconductor substrate located laterally adjacent to the first portion of the skip-level through-silicon via structure;
   a dielectric barrier layer separating the semiconductor substrate from the first portion of the skip-level through-silicon via structure;
   a backside dielectric material region located laterally adjacent to, and in direct physical contact with, a sidewall of the second portion of the skip-level through-silicon via structure;
   a buried power rail located in the semiconductor substrate and in electrical contact with the first surface of the skip-level through-silicon via structure; and
   an n+1 backside metal layer located in the backside dielectric material region and in electrical contact with the second surface of the skip-level through-silicon via structure, wherein the skip-level through-silicon via structure skips electrical connection with each intermediate backside metal layer located above the n+1 backside metal layer.

2. The semiconductor structure of claim 1, wherein the first portion of the skip-level through-silicon via structure has a width that is less than a width of the second portion of the skip-level through-silicon via structure.

3. The semiconductor structure of claim 1, wherein n is 1, and the skip-level through-silicon via structure skips electrical connection to a first backside metal layer.

4. The semiconductor structure of claim 1, wherein n is 2, and the skip-level through-silicon via structure skips electrical connection to a first backside metal layer and a second backside metal layer.

5. The semiconductor structure of claim 1, wherein each intermediate backside metal layer located above the n+1 backside metal layer is located in the backside dielectric material region.

6. The semiconductor structure of claim 1, wherein the backside dielectric material region is located beneath the semiconductor substrate and forms a material interface with a surface of the semiconductor substrate.

7. The semiconductor structure of claim 1, wherein a portion of the dielectric barrier layer contacts a sidewall of the backside dielectric material region.

8. The semiconductor structure of claim 1, wherein the buried power rail has a width that is greater than a width of the first portion of the skip-level through-silicon via structure.

9. The semiconductor structure of claim 1, wherein the skip-level through-silicon via structure is composed of an electrically conductive metal or an electrically conductive metal alloy.

10. The semiconductor structure of claim 1, wherein the n+1 backside metal layer has a width greater than a width of the second portion of the skip-level through-silicon via structure.

11. The semiconductor structure of claim 1, further comprising a non-skip-level through-silicon via structure located in the semiconductor substrate and spaced apart from the skip-level through-silicon via structure, wherein the non-skip-level through-silicon via structure is separated from the semiconductor substrate by another dielectric barrier layer.

12. The semiconductor structure of claim 11, wherein the non-skip-level through-silicon via structure has a first surface in electrical contact with the buried power rail, and a second surface opposite the first surface that is in electrical contact with a first backside metal layer that comprises one of the intermediate backside metal layers.

13. The semiconductor structure of claim 12, wherein an electrically conductive via structure electrically connects the first backside metal layer to a second backside metal layer, wherein the second backside metal layer is the n+1 backside metal layer.

14. The semiconductor structure of claim 1, wherein the n+1 backside metal layer and each intermediate backside metal layer are composed of a backside metal or backside metal alloy.

15. The semiconductor structure of claim 1, wherein each intermediate backside metal layer is spaced apart from the skip-level through-silicon via structure and from the n+1 backside metal layer by the backside dielectric material region.

* * * * *